(12) United States Patent
Liou

(10) Patent No.: US 6,420,773 B1
(45) Date of Patent: Jul. 16, 2002

(54) MULTI-LEVEL SPIRAL INDUCTOR STRUCTURE HAVING HIGH INDUCTANCE (L) AND HIGH QUALITY FACTOR (Q)

(75) Inventor: Ping Liou, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/679,092

(22) Filed: Oct. 4, 2000

(51) Int. Cl.$^7$ .............................................. H01L 29/00
(52) U.S. Cl. ....................................... 257/531; 257/528
(58) Field of Search ................................. 257/528, 531; 336/200, 215

(56) References Cited

U.S. PATENT DOCUMENTS 5,446,311 A    8/1995  Ewen et al. ................. 257/531
5,610,433 A  * 3/1997  Merrill et al. ............... 257/531
5,656,849 A    8/1997  Burghartz et al. .......... 257/528
5,801,521 A  * 9/1998  Mizoguchi et al. ......... 323/282
6,242,791 B1 * 6/2001  Jou ............................. 257/531

* cited by examiner

*Primary Examiner*—Richard Elms
*Assistant Examiner*—Christian D. Wilson
(74) *Attorney, Agent, or Firm*—Niro, Scavone, Haller & Niro

(57) ABSTRACT

A high inductance and high-Q inductor structure formed using multilevel interconnect technology with deep trench has the same current flow direction in each spiral coil pattern. The inductor uses reflection and rotation transformation to generate each spiral coil pattern and neighboring spiral coil pattern relatively rotates with respect to the lower spiral coil pattern. Each spiral coil connection follows the connection code of edge end to edge end and central end to central end through via plugs. Each spiral coil is connected in series and total inductance results from summation of each spiral coil pattern.

11 Claims, 4 Drawing Sheets

MULTI-LEVEL SPIRAL INDUCTOR STRUCTURE HAVING HIGH INDUCTANCE (L) AND HIGH QUALITY FACTOR (Q)

FIELD OF INVENTION

The present invention related to a high inductance and high-Q inductor fabricated by multilevel interconnect technology, and, more in particular, to a spiral inductor having more than 3 spiral coil patterns with the connection code of edge end terminal to edge and central end terminal end to center to generate the same current flow path in all spiral coils.

BACKGROUND OF INVENTION

Active devices such as CMOS and Bipolar transistors have been successfully implemented in integrated circuits (IC) by using current monolithic technology. Passive devices such as resistors and capacitors can be fabricated in current IC technology. Many commercial products operating at radio frequency (RF) band grow faster and become more popular in wireless communication market. Gradually, system-on-chip (SOC) concept would be used in the future integrated circuit (IC) technology. Therefore, excellent inductor design and process need more elaborate development work to achieve SOC RF IC circuits.

U.S. Pat. No. 5,446,311 describes a conventional spiral inductor fabricated with current IC interconnect technology, shown in FIG. 1A. In order to reduce series resistance of metal lines, this inductor structure uses several layers of metal connected with nearby level of metal through multiple via plug arrays. As shown in FIG. 1A, the first metal level 1 is used to as a cross-under to make connection to one end terminal 5 of the spiral metal layer 2. The spiral coils of neighboring metal layers are shunted and connected through via plugs in parallel way. The disadvantage of the prior art is to have quite large inductor area with large parasitic capacitance.

U.S. Pat. No. 5,656,849 improves the inductance of a conventional inductor by using upper spiral coils and lower spiral coils with the same current direction. The advantage of this prior art is to generate more magnetic flux from the summation of lower spiral coil and upper spiral coil contributions. Therefore, the inductance increases as magnetic flux increases. However, the disadvantage of this prior art uses only two metal levels to fabricate the inductor. The inductor with higher inductance needs more spiral coil turns in layout design. Only two metal level can not improve quality factor because of very large inductor layout area. The present invention can increase quality factor by using more metal levels to increase inductance and simultaneously has small inductor layout area. For example, RF IC circuit needs some 18-turn inductors with large inductance and good quality factor. The prior art of U.S. Pat. No. 5,446,311 designs very large inductor layout area with 18-turn spiral coil. According to the prior art of U.S. Pat. No. 5,656,849, this inductor has 9-turn spiral coil for each metal level with large inductor layout. The present invention would design the inductor with 3-turn spiral coil in each metal level to significantly reduce inductor layout area.

SUMMARY OF INVENTION

The present invention is related to a high inductance and high-Q inductor structure which improve disadvantages of the prior arts. The invention uses multilevel interconnect technology to fabricate a high inductance and high-Q inductor which comprises at least three spiral coil patterns with the same current flow direction. The edge terminal of the first spiral coils is connected with the edge terminal of the second spiral coils and the central terminal of the second spiral coil is connected with the central terminal of the third spiral coils through via plugs. Because of reflection and rotation transformations in the invention, total inductor layout area is much smaller than prior arts with the same inductance.

BRIEF DESCRIPTION OF THE APPENDED DRAWINGS

FIG. 1 is the flat spiral inductor in accordance with U.S. Pat. No. 5,446,311;

FIG. 2 schematically demonstrates the square inductor structure which rotates the upper spiral coil relatively respective to the lower spiral coil with various rotation angles confined inside the region of a circle;

DETAILED DESCRIPTION OF THE INVENTION

Figure 1:
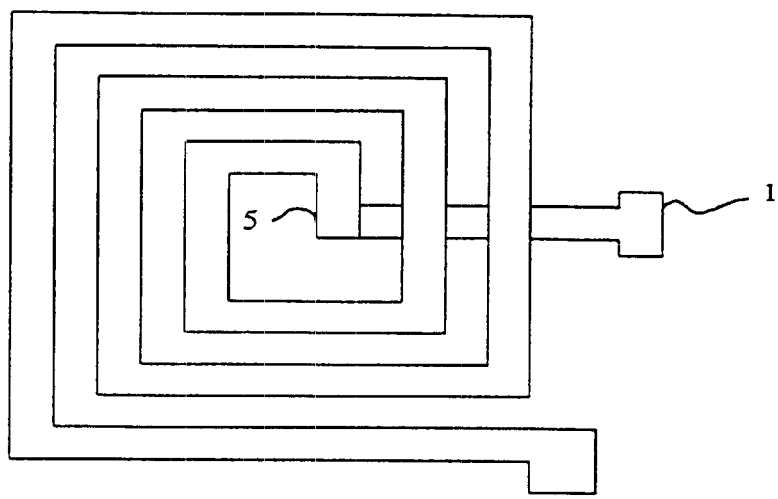
Figure 2:
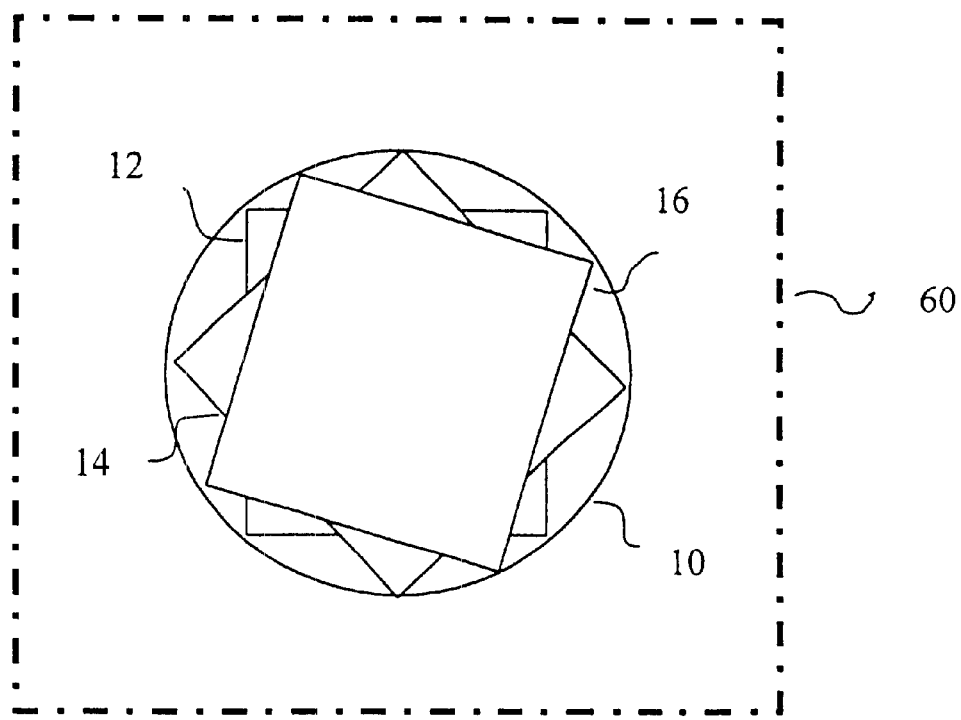
Figure 3:
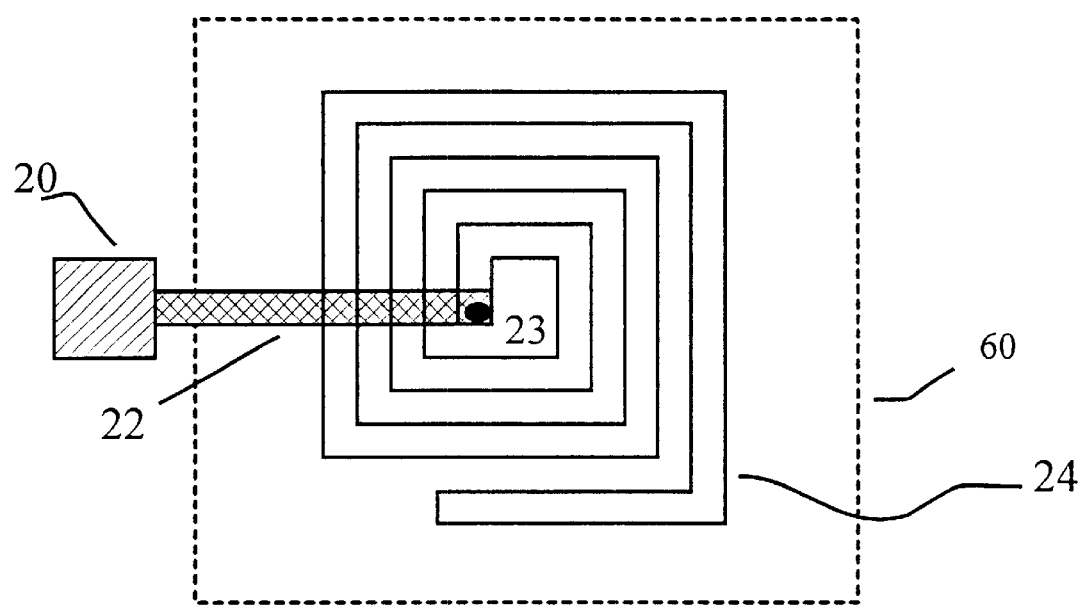
FIG. 3 shows a plan view of a cross-under and the first metal spiral coil in the trench region.

In one of the embodiment related to the present invention, FIG. 2 uses the symbolic patterns 12, 14, 16 to represent the first spiral coil, the second spiral coil, and the third spiral coil, respectively. Basically these square spiral coil patterns with length a have nearly the same area but with different rotation angles and they are all confined in the circle region 10 of diameter R=√2 a. Therefore, the high-L inductor layout would not increase parasitic capacitance due to large area and the layout design could generate the same flow direction of electrical current in each spiral coil clockwise or counterclockwise. The trench region 60 is designed to reduce the parasitic capacitance between the first spiral coil layer and the substrate. As shown in FIG. 3, the first metal level 22 is used as a cross-under conduction line from the pad area to a central terminal portion of the first spiral coils 24. The first spiral coils 24 is manufactured by the second metal level (M2) 24 and is connected to the first metal cross-under line 22 through the first via plugs 23.

Figure 4:
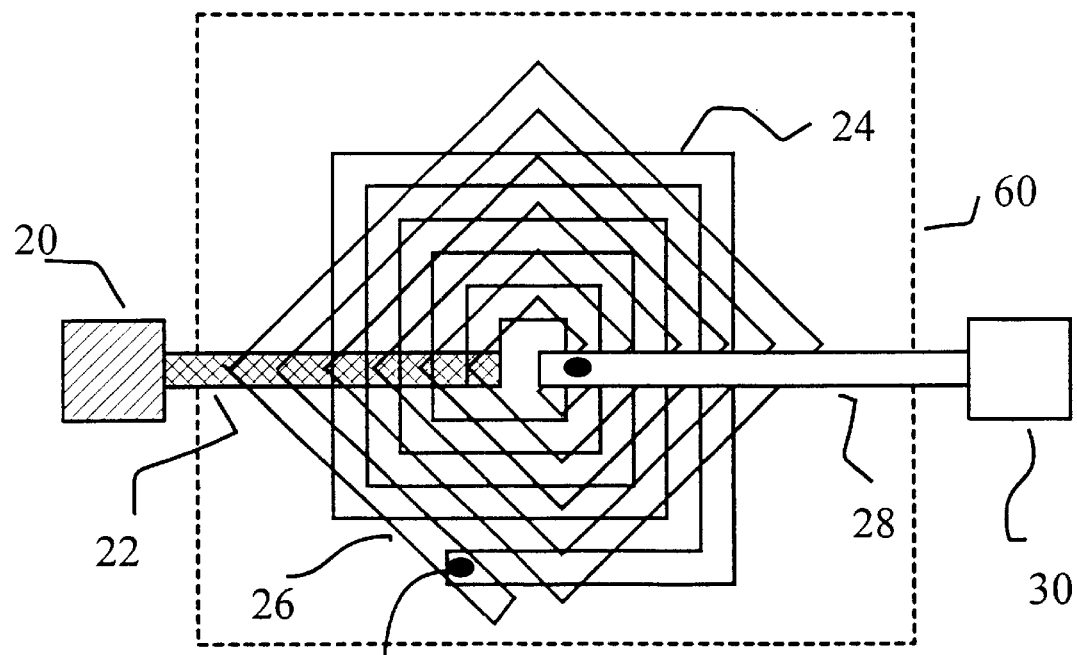
FIG. 4 shows a plan view of the second metal spiral coil rotated with respect to the first metal spiral coil in 45 degree.

As shown in FIG. 4, the second spiral coils 26 is fabricated by the third metal level (M3) and is connected with the first spiral coils 24 by the second via plugs 25. The second spiral pattern is not exactly the same as the first spiral pattern. The second spiral pattern is rotated with 45 degree relative to the first spiral pattern in FIG. 4. The design layout of the second spiral pattern uses 2 kinds of image transformation—reflection (mirror image) and 45 degree rotation clockwise with respect to the center point. According to the inductor structure in FIG. 4, electrical current can flow from pad 20 to pad 30, or in reverse order. For example, electrical current is forced to flow from pad 20 and then flows through the cross-under line 22. As electrical current flows in the first spiral coils 24, the current direction is along clockwise direction. Later electrical current flows to the third metal level through the second via plugs 25. The current direction in the second spiral coils 26 is still along clockwise direction. Finally, electrical current flows to the last metal level which has the cross-above line 28 and pad 30. As shown in FIG. 4, the first spiral coil 24 is 3-turn and the second spiral coil is also 3-turn. Therefore, in this embodiment of FIG. 4, the inductor structure totally has 6 turn coils in the same electrical current flow direction.

Figure 5:
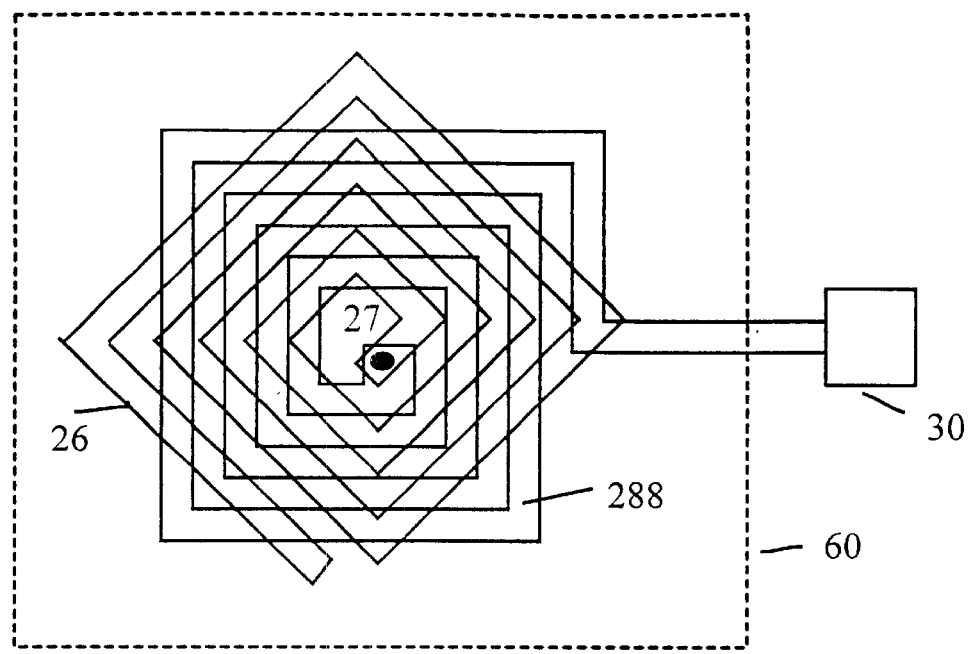
FIG. 5 shows a plan view of the third metal spiral coil rotated with respect to the second metal spiral coil in 45 degree.
Figure 6:
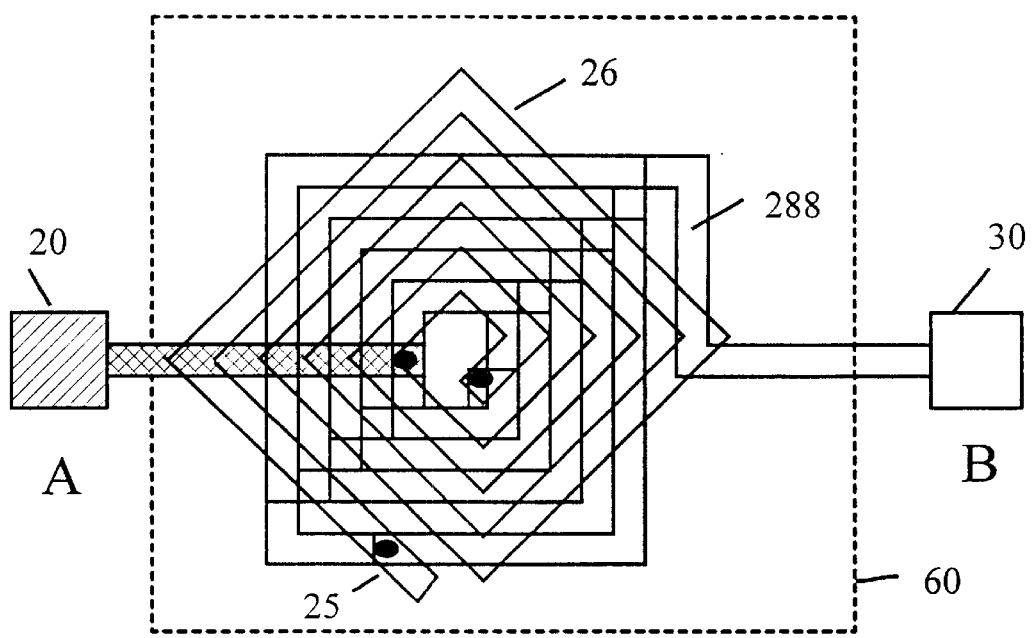
FIG. 6 shows a plan view of the inductor structure in one of the embodiments and the third spiral coil pattern is the same as the first spiral coil after rotation transformation with 45 degree twice.

In another embodiment of the inductor structure shown in FIG. 5, the forth metal level also fabricates the third spiral coils. The third spiral coil 288 is rotated with 45 degree relative to the second spiral pattern 26 in FIG. 5. Similarly, The design layout of the third spiral pattern uses 2 kinds of image transformation—reflection (mirror image) and 45 degree rotation clockwise with respect to the center point. After 2 rotation transformation steps, the third spiral pattern is overlapped with the first spiral pattern. If the electrical current direction in the second spiral coil is clockwise, the current flows to one end terminal of the third spiral through via plugs 27 and flows with clockwise direction in the third spiral coil of the forth metal level. Finally the inductor layout of four metal levels is shown in FIG. 6. Each of the three spiral coils has 3-turn coil pattern. Each spiral coil is connected with another spiral coil in series way. Therefore, in this embodiment of FIG. 6, the inductor structure totally has 9-turn coils in the same electrical current flow direction.

Figure 7:
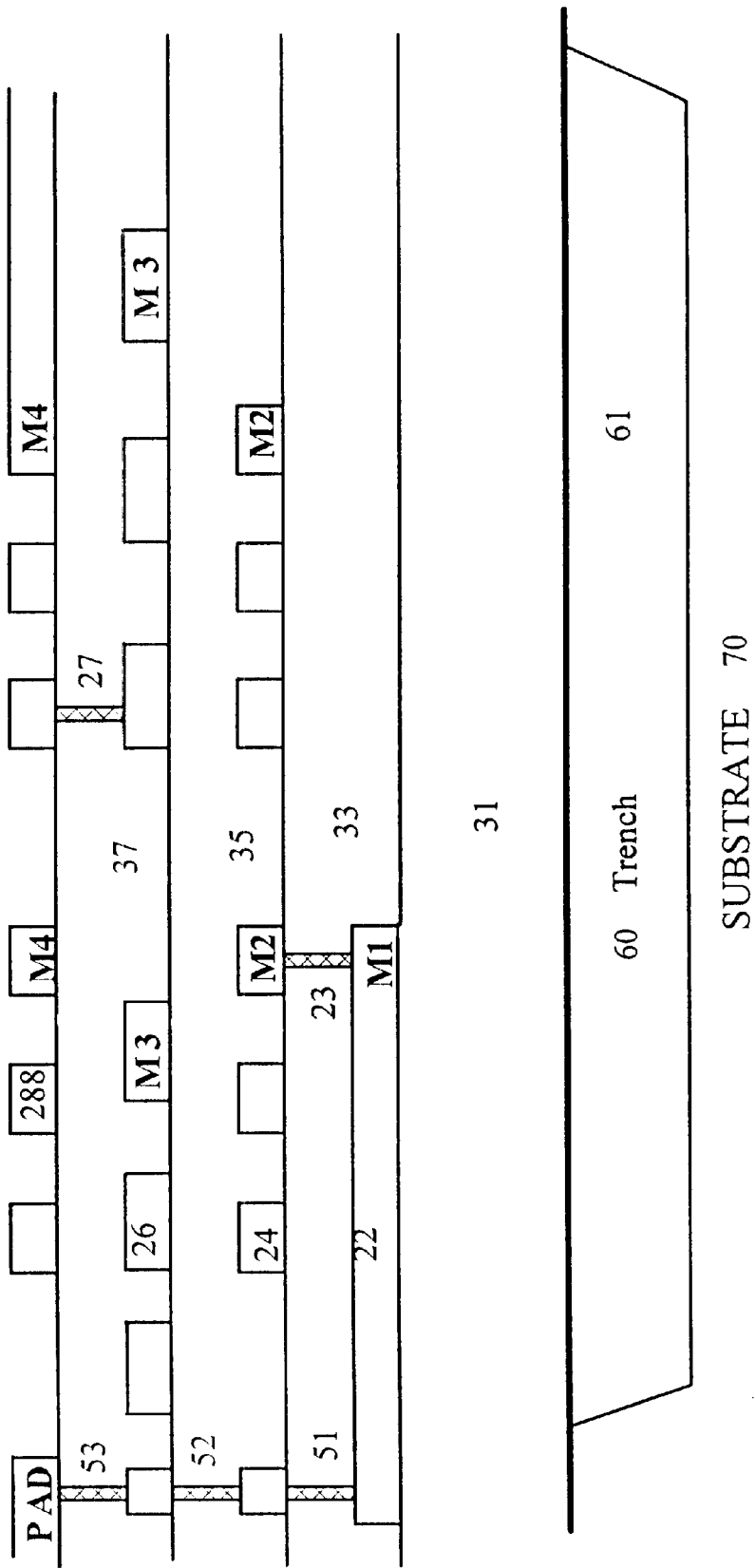
FIG. 7 shows the cross section view of the inductor in FIG. 6 along A-B line.

FIG. 7 shows the cross section view of the inductor structure along A-B line in FIG. 6. First trench patterns 60 are formed on the semiconductor substrate by using photolithographic and dry etch processes. Then ion implantation process is applied to implant only trench area by using different type (N type or P type) ions from (P type or N type) substrate. After dielectric material 61 fills the trench area, CMP (Chemical and Mechanical Polishing) process is applied to planarize the substrate 70. Then insulator film 31 is deposited above the planarized substrate and trench area. Or dielectric material and insulator material may be the same in another fabrication method. In this fabrication method, the dielectric material 61 is thick enough for planarizing trench area and some of dielectric material are left about several um thickness above substrate and trench area after CMP process. Therefore, the first insulator material 31 is not used in this method. Deep trench formation is better to have higher quality factor of the monolithic inductor because of smaller parasitic capacitance.

Then the first metal film is deposited above the first insulator 31 by using sputtering technique and the metal cross-under line 22 is formed by using photolithographic and dry etch processes. The second insulator material 33 is deposited above M1 level and the first insulator material 31. All of via plugs are formed by Tungsten plug or Aluminum plug process. The first via plug 23 is used to connect one end terminal of the first spiral coil 24 with the metal cross-under line 22. The third via plug 27 is used to connect one end terminal of the third spiral coil 288 with the second spiral coil 26. Via plugs 51, 52, and 53 are used as conduction connection between pad and the other end terminal of cross-under line 22. In order to reduce parasitic capacitance between metal lines, these insulator materials 31, 33, 35, and 37 are better to have lower dielectric constant.

The inductor structure of the present invention can be extended to more metal level inductor by using multilevel interconnect technology. For example, with reflection and 45 degree rotation transformation, the edge end terminal of the first spiral coil is connected with the edge end terminal of the second spiral coil through via plug. The central end terminal of the second spiral coil is connected with the central end terminal of the third spiral coil through via plug. Because of 45 degree rotation with respect to the center of the first spiral coil pattern, the position of the third spiral coil pattern is the same as that of the first spiral coil. If the inductor structure uses more than 4 metal levels, the forth spiral coil pattern has the same position as the second spiral coil pattern. Therefore, the inductor structure of the present invention is able to have higher inductance (high-L) through summation of each spiral coil turn because the rest metal levels of the spiral coil pattern can be produced by the previous spiral coil patterns.

In order to increase quality factor, the inductor structure uses the trench pattern in substrate to decrease parasitic capacitance between metal level and substrate. The first metal level is used to fabricate the cross-under line to connect the first spiral coils of the second metal level. Because there are two insulation layers (insulators 31 and 33) with trench between the spiral coil and substrate, the total thickness of dielectric film can decrease parasitic capacitance. Similarly, thicker insulator between metal levels is able to increase the quality factor of the inductor. In another embodiment, the spiral coil pattern uses different metal level instead of neighboring metal level. For example, the second metal level is used as conducting path instead of fabricating spiral coil pattern. The first and second spiral coil patterns are produced by the third and fifth metal levels respectively.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A high inductance and high-Q monolithic inductor structure for RF application fabricated by using a multilevel interconnect technology of m conducting levels, wherein m is a nature number larger than 4, comprising:

a first insulator formed on a substrate of said inductor structure;

a first metal level used as a conducting cross-under line formed on said first insulator and then a second insulator formed on said first insulator and said first metal level;

a first spiral coil with $N_1$ turn fabricated by a second metal level and formed on said second insulator over said first metal level and then a third insulator formed on said second insulator and said second metal level;

a second spiral coil with $N_2$ turn fabricated by a third metal level, formed on said third insulator over said first spiral coil and positioned with reflection and rotation transformations with respect to the center of said first spiral coil and then a fourth insulator formed on said third insulator and said third metal level;

a third spiral coil with $N_3$ turn fabricated by a fourth metal level, formed on said fourth insulator over said second spiral coil and positioned with reflection and rotation transformations with respect to the center of said first spiral coil and then a fifth insulator formed on said fourth insulator and said fourth metal level; and an edge end terminal of said first spiral coil connected to an edge end terminal of said second spiral coil through a first via plug and a central end terminal of said second spiral coil connected to a central end terminal of said third spiral coil through a second via plug, wherein $N_1$, $N_2$ and $N_3$ are nature numbers and not smaller than 3 ($\leq 3$) and said conducting cross-under line is connected between a first pad and said first spiral coil, thereby said first, second and third spiral coils include current flows in the same direction.

2. The inductor structure of claim 1, wherein said first, second and third spiral coils have different coil turn numbers.

3. The inductor structure of claim 1, wherein said fourth metal level is used as an electrical connection path between a second pad and one end of said third spiral coil.

4. The inductor structure of claim 1, wherein said first and second spiral coils and said second and third spiral coils are rotated relatively with 45 degrees, respectively.

5. The inductor structure of claim 1, further comprising a trench formed in said substrate before forming said first insulator.

6. The inductor structure of claim 1, wherein said first, second and third insulators are made of silicon dioxide.

7. The inductor structure of claim 1, wherein said first, second and third insulators are made of a dielectric material with a dielectric constant less than 4.

8. The inductor structure of claim 1, wherein said first, second and third spiral: coils are made of a conducting material selected from a group consisting of Aluminum, Copper and Gold, respectively.

9. The inductor structure of claim 1, wherein said first and said second via plugs are made of a material selected from Tungsten and Aluminum, respectively.

10. The inductor structure of claim 5, wherein said trench is formed by applying an ion implant process with different type dopant ions from a substrate dopant type.

11. The inductor structure of claim 1, wherein said first, second and third spiral coils have the same coil turn number.

* * * * *